United States Patent
Hou et al.

(10) Patent No.: US 10,032,625 B2
(45) Date of Patent: Jul. 24, 2018

(54) METHOD OF FORMING A SEMICONDUCTOR DEVICE COMPRISING TITANIUM SILICON OXYNITRIDE

(71) Applicant: TAIWAN SEMICONDUCTOR MANUFACTURING COMPANY, LTD., Hsinchu (TW)

(72) Inventors: Cheng-Hao Hou, Hsinchu (TW); Xiong-Fei Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/876,169

(22) Filed: Oct. 6, 2015

(65) Prior Publication Data

US 2016/0027639 A1 Jan. 28, 2016

Related U.S. Application Data

(60) Continuation of application No. 14/468,039, filed on Aug. 25, 2014, now Pat. No. 9,165,826, which is a continuation-in-part of application No. 14/303,045, filed on Jun. 12, 2014, which is a division of application No. 13/195,554, filed on Aug. 1, 2011, now Pat. No. 8,765,603.

(51) Int. Cl.
| | |
|---|---|
| *H01L 21/02* | (2006.01) |
| *H01L 29/51* | (2006.01) |
| *H01L 29/49* | (2006.01) |
| *H01L 21/28* | (2006.01) |
| *H01L 21/768* | (2006.01) |
| *H01L 29/78* | (2006.01) |

(52) U.S. Cl.
CPC .. *H01L 21/02153* (2013.01); *H01L 21/28088* (2013.01); *H01L 21/76841* (2013.01); *H01L 21/76843* (2013.01); *H01L 21/76856* (2013.01); *H01L 21/76864* (2013.01); *H01L 29/4966* (2013.01); *H01L 29/513* (2013.01); *H01L 29/517* (2013.01); *H01L 21/76855* (2013.01); *H01L 29/7833* (2013.01)

(58) Field of Classification Search
CPC ......... H01L 21/76855; H01L 21/02153; H01L 21/76856; H01L 21/76864; H01L 21/76843; H01L 29/513; H01L 21/76841
USPC ......................................... 438/653, 198, 785
See application file for complete search history.

(56) References Cited

U.S. PATENT DOCUMENTS 7,521,309 B2 * 4/2009 Kaneko ............. H01L 21/28097
                                                     438/199
7,902,610 B2    3/2011 Tai et al.
(Continued)

FOREIGN PATENT DOCUMENTS

JP    2005294799    * 10/2005
JP    2005347631    * 12/2005
(Continued)

*Primary Examiner* — Bo Fan
(74) *Attorney, Agent, or Firm* — Hauptman Ham, LLP

(57) ABSTRACT

A method of making a semiconductor device includes forming a titanium nitride layer over a gate dielectric layer. The method further includes performing a silicon treatment on the titanium nitride layer to form at least one silicon monolayer over the titanium nitride layer. The method further includes driving silicon from the at least one silicon monolayer into the titanium nitride layer to form a TiSiON layer.

20 Claims, 8 Drawing Sheets

(56) References Cited

U.S. PATENT DOCUMENTS

| | | |
|---|---|---|
| 8,188,547 B2 | 5/2012 | Manabe |
| 2006/0154413 A1 | 7/2006 | Luo |
| 2006/0264066 A1* | 11/2006 | Bartholomew ....... C23C 16/308 438/785 |
| 2008/0242017 A1 | 10/2008 | Lee |
| 2010/0052079 A1 | 3/2010 | Hirano |
| 2010/0176456 A1 | 7/2010 | Ikeno |
| 2013/0020656 A1 | 1/2013 | Jakubowski et al. |

FOREIGN PATENT DOCUMENTS

| | | | |
|---|---|---|---|
| JP | 2006005087 | * | 1/2006 |
| JP | 2006114591 | * | 4/2006 |

* cited by examiner

METHOD OF FORMING A SEMICONDUCTOR DEVICE COMPRISING TITANIUM SILICON OXYNITRIDE

PRIORITY CLAIM

The present application is a continuation of U.S. application Ser. No. 14/468,039, filed Aug. 25, 2014, which is a continuation-in-part of U.S. application Ser. No. 14/303,045, filed Jun. 12, 2014, which is a divisional of U.S. application Ser. No. 13/195,554, filed Aug. 1, 2011, now U.S. Pat. No. 8,765,603, issued Jul. 1, 2014, which are incorporated herein by reference in their entireties.

BACKGROUND

High-k dielectric materials are now used in many semiconductor devices as replacements for the silicon dioxide gate insulator that has previously been used. The high-k dielectric materials allow the continued scaling of semiconductor devices to smaller dimensions without sacrificing performance of the semiconductor devices. Polysilicon is a gate electrode material used in semiconductor devices which use silicon dioxide as the gate insulator. To manage the inherent threshold voltage value in the semiconductor devices that use high-k dielectric materials as the gate insulator, the polysilicon is replaced by an n-type or p-type metal. Barrier layers are used to prevent diffusion of the n-type or p-type metal toward the high-k dielectric materials as the diffusion may cause Time Dependent Dielectric Breakdown (TDDB) of the semiconductor devices. Thinner barriers that prevent diffusion of the n-type or p-type metal toward the high-k dielectric allow smaller, more reliable, more power efficient and faster semiconductor devices to be fabricated.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
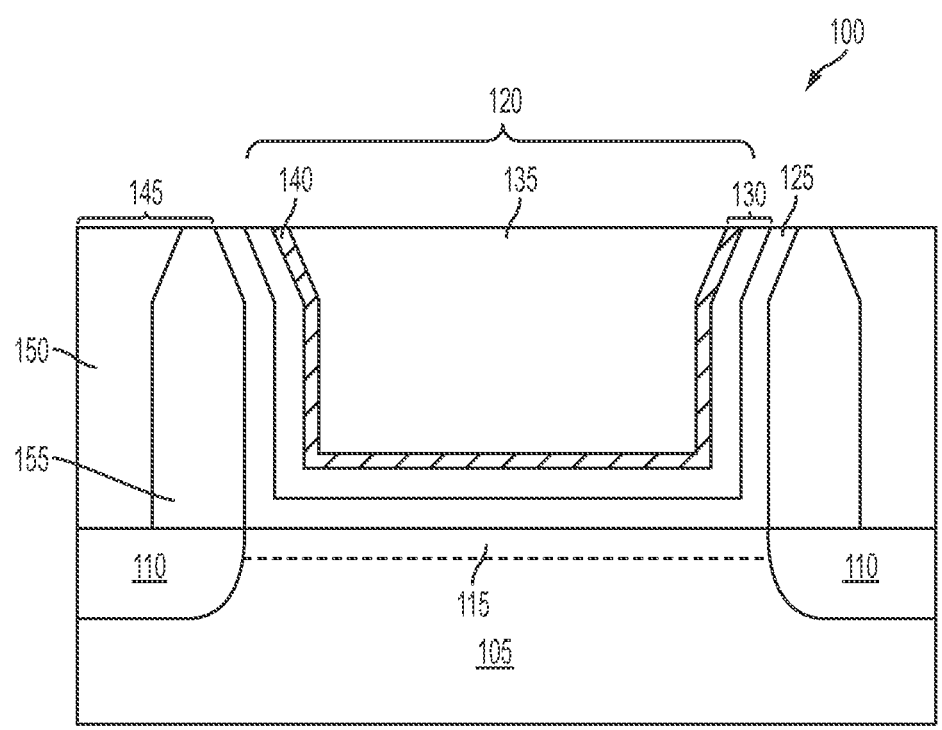
FIG. 1 is a cross-section view of a semiconductor device according to an embodiment.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a cross-section view of a semiconductor device 100 according to an embodiment. The semiconductor device 100 comprises a substrate 105 in which source/drain regions 110 are formed toward an upper portion thereof. A channel region 115 is formed in the substrate 105 between the source/drain regions 110. A gate 120 comprising a gate dielectric layer 125, a cap barrier layer 130 and a metal gate stack 135 is formed over the channel region 115 and the source/drain regions 110. The cap barrier layer 130 further comprises an annealed silicon portion 140.

In some embodiments, an inter-layer dielectric 145 is formed over the substrate 105. The inter-layer dielectric 145 comprises a dielectric 150 deposited on either side of the gate 120 of the semiconductor device 100. In some embodiments, spacers 155 are formed between the dielectric 150 and the gate 120. In some embodiments, the spacers 155 define an opening in the inter-layer dielectric 145 in which the gate dielectric layer 125, the cap barrier layer 130 and the metal gate stack 135 are formed. In some embodiments, the dielectric 150 is formed of silicon oxide or an insulating material having a low dielectric constant. In some embodiments, the source/drain regions 110 are defined by a dummy gate structure (not shown) and the spacers 155, the dummy gate structure and the spacers 155 being used either separately or together as masks for one or more implantations. In some embodiments, source/drain regions 110 comprise lightly doped drain (LDD) regions.

The gate dielectric layer 125 insulates the gate from the channel. The gate dielectric layer 125 is a high-k dielectric layer which comprises a layer having a dielectric constant greater than the dielectric constant of silicon dioxide. In some embodiments, the gate dielectric layer 125 may include hafnium oxide, hafnium oxide doped with one or more of zirconium, aluminum oxide, tantalum oxide, zirconium oxide, indium oxide, lanthanum oxide or yttrium oxide, hafnium silicon oxide, hafnium silicon oxynitride, hafnium tantalum oxide, hafnium titanium oxide, hafnium zirconium oxide hafnium aluminum oxide, aluminum silicon oxide, strontium oxide, strontium titanium oxide, yttrium silicon oxide, and/or combinations thereof. The gate dielectric layer 125 may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. In some embodiments, the gate dielectric layer 125 may have a thickness in the range of about 1 to 4 nm.

The gate dielectric layer 125 may be formed by suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

The cap barrier layer 130 is formed over the gate dielectric layer 125. The cap barrier layer 130 prevents diffusion of atoms ions and molecules between the gate dielectric layer 125 and material formed over the cap barrier layer 130, including the various materials (for example, Ti, Ag, Al, TiAl, TiAlN, TaC, TaCN, TaSiN, Mn, and/or Zr) in the metal gate stack 135. In some embodiments, the cap barrier layer 130 is formed from titanium nitride and includes an annealed silicon layer 140. In some embodiments, the annealed silicon portion 140 comprises silicon that has reacted with titanium in the titanium nitride to form a titanium silicide alloy.

Suitable techniques for forming the titanium nitride in the cap barrier layer 130 can be used such as physical vapor deposition (PVD), metal organic chemical vapor deposition (MOCVD), pulsed laser deposition (PLD), atomic layer deposition (ALD) and other film growth techniques. Alternatively, titanium nitride can be formed by using low pressure chemical vapor deposition (LPCVD), plasma enhanced chemical vapor deposition (PECVD), high density plasma chemical vapor deposition (HDPCVD), or various sputtering techniques, to a thickness suitable for forming a titanium nitride layer.

The metal gate stack 135 is formed over the cap barrier layer 130. In some embodiments, the metal gate stack 135 includes a work function layer, a metal diffusion blocking layer and a metal filling line sequentially formed over the cap barrier layer 130.

In some embodiments, the metal gate stack 135 comprises an n-type metal. In some embodiments the n-type metal is formed from materials such as metal, metal carbide, metal nitride hafnium, zirconium, titanium, tantalum, aluminum, metal carbides, other suitable materials, or the combinations thereof. In one or more embodiments, the n-type metal comprises at least one of titanium, aluminum, titanium-aluminum, titanium nitride, cobalt, tungsten nitride, or tantalum carbide. For example, the n-type metal comprises at least one of titanium, aluminum, titanium-aluminum, when metal gate stack 135 is a part of an N-channel MOS (NMOS) transistor.

If the metal gate stack 135 contains aluminum, the aluminum diffuses through the cap barrier layer 130 toward the gate dielectric layer 125 if the cap barrier layer 130 material is titanium nitride. Incorporating silicon into the titanium nitride cap barrier layer 130 prevents the diffusion of aluminum and increases the life of the semiconductor device 100.

The annealed silicon portion 140 in FIG. 1 is formed at a surface of the cap barrier layer 130 adjacent to the metal gate stack 135. In some embodiments, the annealed silicon portion 140 is formed at a surface of the cap barrier layer 130 adjacent to an n-metal portion of the metal gate stack 135.

Figure 2:
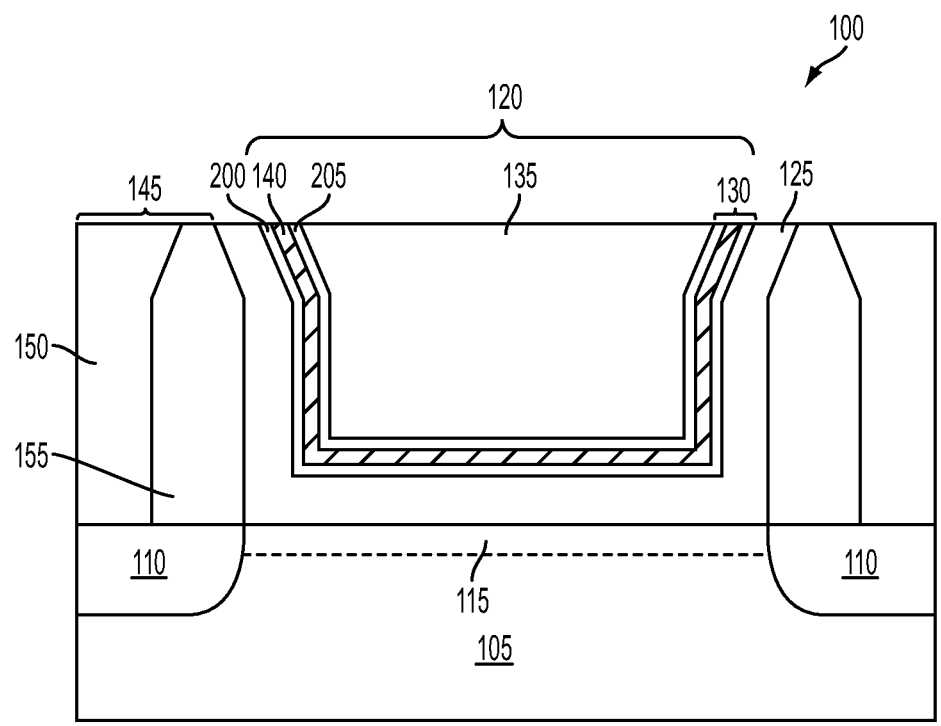
FIG. 2 is a cross-section view of a semiconductor device according to another embodiment.

FIG. 2 is a cross-section view of a semiconductor device according to another embodiment. The cap barrier layer 130 comprises a titanium nitride portion 200, 205 and the annealed silicon portion 140. In some embodiments, the annealed silicon portion 140 comprises silicon that has reacted with titanium in the titanium nitride to form a titanium silicide alloy.

The annealed silicon portion 140 in FIG. 2 is formed away from surfaces of the cap barrier layer 130, so that titanium nitride layers 200, 205 are formed on either side of the annealed silicon portion 140, separating the annealed silicon portion 140 from the gate dielectric layer 125 and the metal gate stack 135.

Figure 3:
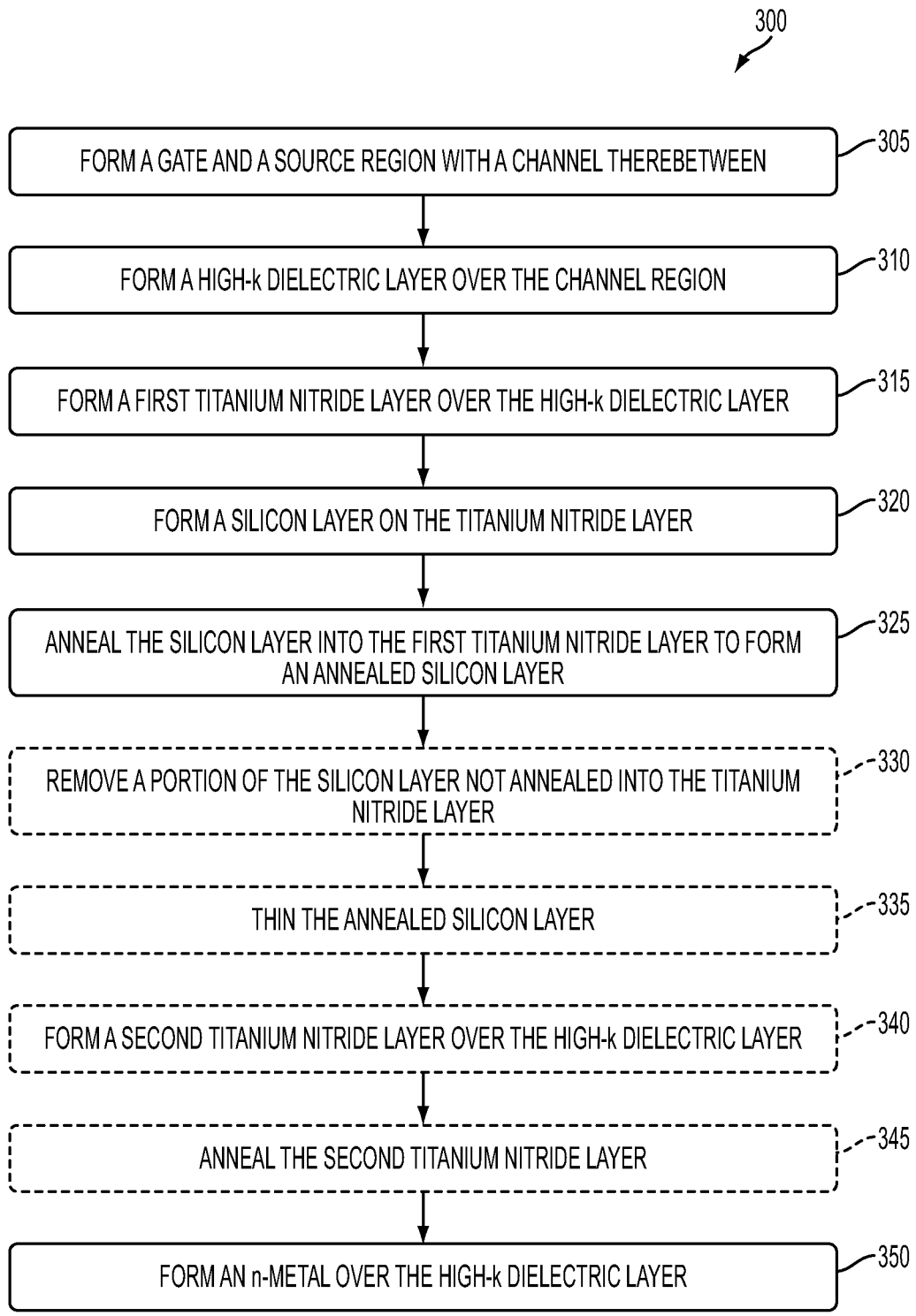
FIG. 3 is a flow chart for a method of forming the semiconductor device of FIGS. 1 and 2.

FIG. 3 is a flow chart for a method 300 of forming the semiconductor device 100 of FIGS. 1-2.

The method begins at step 305 in which the drain and source regions 110 (FIG. 1) are formed in the substrate 105 (FIG. 1). In some embodiments, the drain and source regions 110 are formed by one or more implantations using the dummy gate and the spacers 155 as masks. A portion of the substrate between the drain and source regions 110 becomes the channel region 115. The method proceeds to step 310.

At step 310, the high-k dielectric layer 125 is formed over the channel region 115 using one of the material and deposition methods discussed above. The method proceeds to step 315.

Steps 315 to 345 are then performed to form the cap barrier layer 130 as in FIGS. 1 and 2. These steps include optional steps 330 to 345.

Specifically, at step 315, a titanium nitride layer 200 is formed over the high-k dielectric layer using one of the material and deposition methods discussed above. The thickness of the titanium nitride layer 200 is in the range from about 0.5 nm to 4 nm thick. The method proceeds to step 320.

Figure 4:
FIG. 4 is a cross-section view of a portion of the cap barrier layer of FIGS. 1 and 2 during fabrication according to another embodiment.

Referring to FIGS. 3 and 4, at step 320, a silicon layer 400 is formed on the titanium nitride layer 200. In some embodiments, the silicon layer 400 is formed to a thickness of from 5 Å to 10 Å. In some embodiments, the silicon thickness is selected so that in a subsequent annealing step all of the deposited silicon is consumed by the titanium nitride 200 to form compounds of silicon. In other embodiments, the silicon layer 400 is formed to a thickness of from 50 Å to 1000 Å. The method proceeds to step 325.

Figure 5:
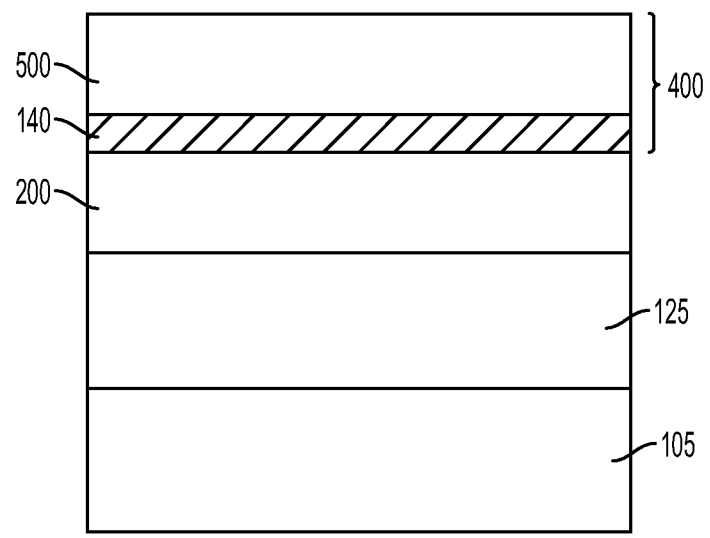
FIG. 5 is a cross-section view of a portion of the cap barrier layer of FIGS. 1 and 2 during fabrication according to another embodiment.

Referring to FIGS. 3 and 5, at step 325, the silicon layer 400 is annealed into the titanium nitride layer 200 to form an annealed silicon layer 140. In some embodiments, the anneal is an oven anneal at from 400° C. to 1200° C. for from 10 minutes to 30 minutes. In other embodiments, the anneal is a rapid thermal anneal at from 500° C. to 1200° C. for from 0.01 minutes to 1 minutes. In some embodiments, the annealed silicon layer 140 comprises titanium silicide. In some embodiments, the anneal step 325 consumes all of the silicon layer 400. In other embodiments, a portion 500 of the silicon layer 400 is not consumed by the anneal step 325. The method proceeds to step 330.

At step 330, a portion of the silicon layer not consumed (i.e., portion 500) is optionally removed. In some embodiments, the portion 500 of the silicon layer 400 is removed using a wet etch solution comprising dilute hydrofluoric acid and ammonium hydroxide. The dilute hydrofluoric acid and ammonium hydroxide does not etch the silicon layer annealed into the titanium nitride, annealed silicon layer 140. Therefore, the above etch solution removes the remaining portion 500 that was not consumed during the anneal process without thinning the annealed silicon layer 140. In some embodiments, the ratio of dilute hydrofluoric acid and ammonium hydroxide is in the range from 1:20 to 1:100. The method proceeds to step 335.

At step 335, the annealed silicon layer 140 is optionally thinned. In some embodiments, the annealed silicon layer 140 is thinned using a wet etch solution comprising dilute hydrofluoric acid and hydrogen peroxide. In some embodiments, the ratio of dilute hydrofluoric acid and hydrogen peroxide is in the range from 1:10 to 1:500. The method proceeds to step 340.

At step 340, a second layer of titanium nitride 205 is optionally formed on the annealed silicon layer 140 to form the structure as in FIG. 2 with titanium nitride layers 200, 205 on either side of the annealed silicon layer 140. In some embodiments, the thickness of the second layer of titanium nitride 205 is in the range from 0.5 nm to 2.5 nm thick. The method proceeds to step 345.

At step 345, the second layer of titanium nitride 205 is optionally annealed. In some embodiments, the anneal is an oven anneal at from 400° C. to 1200° C. for from X 10 minutes to 30 minutes. In other embodiments, the anneal is a rapid thermal anneal at from 500° C. to 1200° C. for from 0.01 minutes to 1 minute. The method proceeds to step 350.

At step 350, the metal gate stack 135 including the n-metal is formed over cap barrier layer 130 using a combination of the materials and deposition methods discussed above. In some embodiments, the metal gate stack 135 comprises aluminum.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

Figure 6:
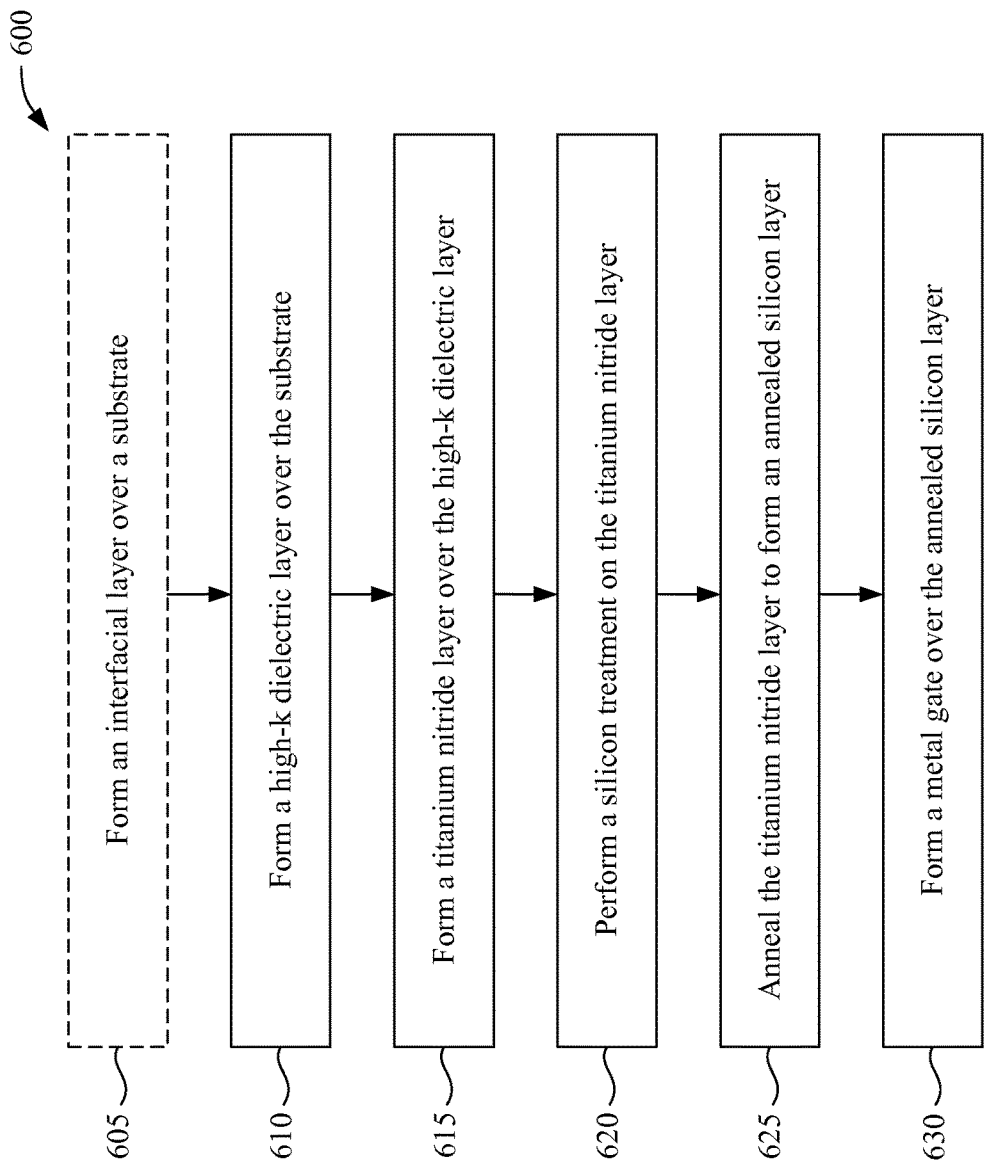
FIG. 6 is a flowchart of a method of making a semiconductor device in accordance with some embodiments.

FIG. 6 is a flowchart of a method 600 of making a semiconductor device in accordance with some embodiments. In operation 605, an interfacial layer is formed over a substrate. In some embodiments, the interfacial layer includes silicon oxide, silicon nitride, or silicon oxynitride, or another suitable interfacial material. In some embodiments, the interfacial layer has a thickness ranging from about 6 angstroms to about 8 angstroms. In some embodiments, the interfacial layer is formed by ALD, CVD, PVD, RPCVD, PECVD, MOCVD, sputtering, plating, another suitable process, or combinations thereof. In some embodiments, operation 605 is omitted.

In operation 610 a high-k dielectric layer is formed over the substrate. In some embodiments, the high-k dielectric layer is formed on the interfacial layer. In some embodiments where the interfacial layer is omitted, the high-k dielectric layer is formed directly on the substrate. The high-k dielectric layer has a dielectric constant greater than the dielectric constant of silicon dioxide. In some embodiments, the high-k dielectric layer includes hafnium oxide, hafnium oxide doped with one or more of zirconium, aluminum oxide, tantalum oxide, zirconium oxide, indium oxide, lanthanum oxide or yttrium oxide, hafnium silicon oxide, hafnium silicon oxynitride, hafnium tantalum oxide, hafnium titanium oxide, hafnium zirconium oxide hafnium aluminum oxide, aluminum silicon oxide, strontium oxide, strontium titanium oxide, yttrium silicon oxide, other suitable high-k dielectric materials or combinations thereof. In some embodiments, the high-k dielectric layer includes metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or combinations thereof. In some embodiments, the high-k dielectric layer has a thickness in the range from about 1 nanometer (nm) to about 4 nm.

In some embodiments, the high-k dielectric layer is formed by suitable process, such as ALD, CVD, PVD, RPCVD, PECVD, MOCVD, sputtering, plating, other suitable processes, or combinations thereof.

In operation 615, a titanium nitride layer is formed over the high-k dielectric layer. In some embodiments, a thickness of the titanium nitride layer ranges from about 0.5 nm to about 4 nm. In some embodiments, the titanium nitride layer is formed by PVD, MOCVD, PLD, ALD, other deposition process, or combinations thereof. In some embodiments, the titanium nitride layer is formed by LPCVD, PECVD, HDPCVD, various sputtering techniques, other suitable formation process, or combinations thereof.

Figure 7A:
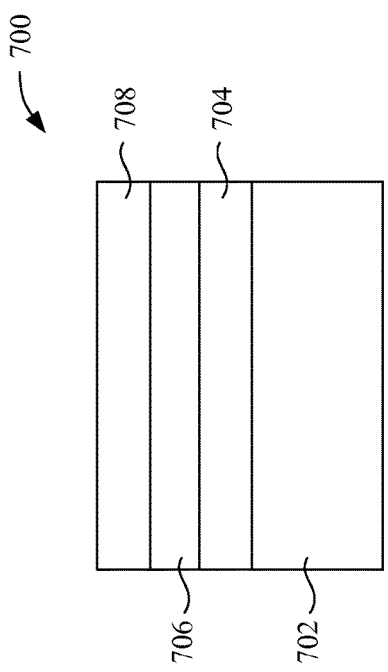
FIGS. 7A-7D are cross-sectional views of a portion of a gate structure of a semiconductor device at various stages of production in accordance with some embodiments.

FIG. 7A is a cross sectional view of a portion of a semiconductor device 700 following operation 615 in accordance with some embodiments. Semiconductor device 700 includes a substrate 702. An interfacial layer 704 is over substrate 104; and a high-k dielectric layer 706 is over the interfacial layer. In some embodiments, interfacial layer 704 is omitted and high-k dielectric layer 706 is in direct contact with substrate 102. A titanium nitride layer 708 is over high-k dielectric layer 706.

Substrate 102 includes a channel region similar to channel region 115 (FIG. 1). In some embodiments, substrate 102 is a semiconductor substrate such as silicon, silicon germanium, or another suitable semiconductor material. In some embodiments, substrate 102 is a silicon on insulator (SOI) substrate. In some embodiments, substrate 102 is doped. In some embodiments, substrate 102 is undoped to non-intentionally doped.

Returning to FIG. 6, method 600 continues with operation 620 in which a silicon treatment is performed on the titanium nitride layer. The silicon treatment forms at least one monolayer of silicon on the titanium nitride layer. A monolayer is a layer having a thickness equal to a single atom. In some embodiments, a number of monolayers formed by the silicon treatment ranges from about 1 to about 5. The number of monolayers is determined by a number of iterations of the silicon treatment.

The silicon treatment is performed in the presence of a silicon-containing gas. In some embodiments, the silicon-containing gas includes silane ($SiH_4$), disilane ($Si_2H_6$), or silicon tetrachloride ($SiCl_4$). In some embodiments, the silicon treatment is performed in the presence of a carrier gas, such as helium (He), argon (Ar), neon (Ne), nitrogen gas ($N_2$), or another suitable carrier gas. In some embodiments, the silicon treatment is performed at a temperature ranging from about 300° C. to about 420° C. If a temperature of the silicon treatment is too high, formation of the at least one silicon monolayer will have reduced efficiency due to high kinetic energy of the silicon-containing gas, in some embodiments. If a temperature of the silicon treatment is too low the silicon will be thicker than a monolayer in some locations, in some embodiments.

In some embodiments, a duration of the silicon treatment ranges from about 10 seconds (s) to about 100 s. The duration of the silicon treatment is a time period from a beginning of the silicon treatment to an end of the silicon treatment. If the duration of the silicon treatment is too short, a risk of an incomplete or partial monolayer increases, in some embodiments. If the duration of the silicon treatment is too long, a thickness of the silicon will be greater than a monolayer, in some embodiments.

Figure 7B:
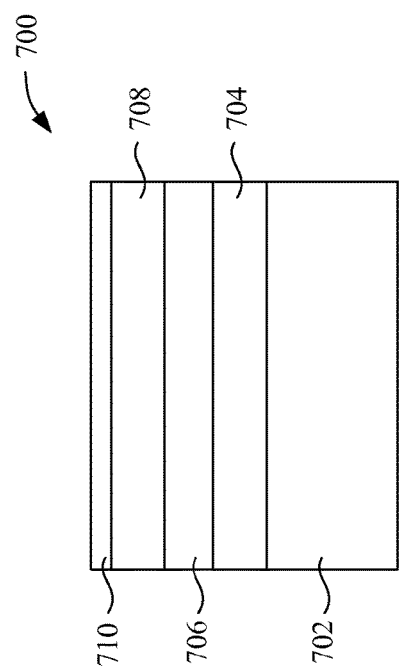

FIG. 7B is a cross-sectional view of a portion of semiconductor device 700 in accordance with some embodiments. In comparison with FIG. 7A, semiconductor device 700 in FIG. 7B includes at least one silicon monolayer 710 over titanium nitride layer 708.

Returning to FIG. 6, method 600 continues with annealing the semiconductor device to form an annealed silicon layer, in operation 625. The annealing causes the silicon from the at least one silicon monolayer to diffuse into the titanium nitride layer and react with the titanium. The annealing process is performed in the presence of an oxygen-containing gas. The oxygen-containing gas also reacts with the silicon and the titanium nitride layer. In some embodiments, the oxygen-containing gas includes oxygen gas ($O_2$), nitric oxide (NO), another suitable oxygen-containing gas, or combinations thereof. The reactions between the silicon, oxygen, and titanium nitride result in the formation of a TiSiON layer. The TiSiON layer is over a remaining portion of the titanium nitride layer. In some embodiments, the TiSiON layer has a thickness ranging from about 3 angstroms to about 5 angstroms. If the thickness of the TiSiON layer is too thin, the TiSiON layer will not be able to effectively prevent diffusion into the titanium nitride layer, in some embodiments. If the thickness of the TiSiON layer is too thick, the TiSiON layer will reduce a conductivity between a metal gate and the titanium nitride layer.

In some embodiments, the annealing is performed at a temperature ranging from about 600° C. to about 1000° C. If the temperature of the annealing is too low, the silicon from the at least one silicon monolayer will not diffuse into the titanium nitride layer, in some embodiments. If the temperature of the annealing is too high, the thickness of the TiSiON layer will be too great, in some embodiments. In some embodiments, a duration of the annealing process ranges from about 0.1 s to about 10 s. If the duration of the annealing is too short, the silicon from the at least one silicon monolayer will not diffuse into the titanium nitride layer, in some embodiments. If the duration of the annealing is too long, the thickness of the TiSiON layer will be too great, in some embodiments. In some embodiments, the annealing is performed in the presence of nitrogen gas ($N_2$), ammonium ($NH_3$), another suitable processing gas, or combinations thereof.

Figure 7C:
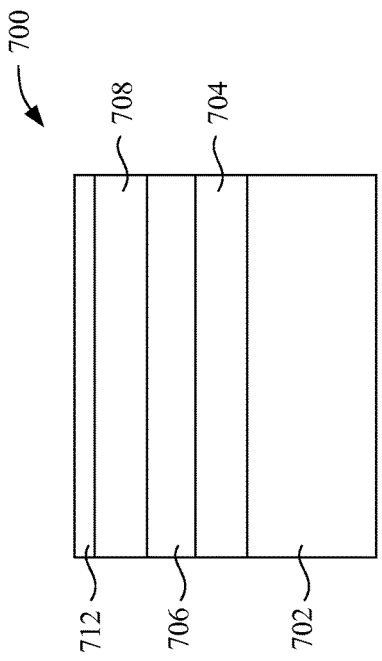

FIG. 7C is a cross-sectional view of a portion of semiconductor device 700 after operation 625. In comparison with FIG. 7B, FIG. 7C includes a TiSiON layer 712 over titanium nitride layer 708. At least one silicon monolayer 710 is replaced by TiSiON layer 712 due to reactions of the silicon from the at least one silicon monolayer and oxygen with titanium nitride layer 708 during the annealing process.

Returning to FIG. 6, method 600 continues with the formation of a metal gate over the annealed silicon layer, in operation 630. In some embodiments, the metal gate is a gate electrode for a transistor. In some embodiments, the metal gate includes an n-type metal. In some embodiments, the n-type metal includes metal, metal carbide, metal nitride hafnium, zirconium, titanium, tantalum, aluminum, metal carbides, other suitable materials, or the combinations thereof. In some embodiments, the n-type metal includes at least one of titanium, aluminum, titanium-aluminum, titanium nitride, cobalt, tungsten nitride, or tantalum carbide. In some embodiments, the metal gate includes titanium aluminum, titanium aluminum carbide, tantalum aluminum carbide, or another suitable metal gate material. In some embodiments, the metal gate is formed by PVD, MOCVD, PLD, ALD, LPCVD, PECVD, HDPCVD, various sputtering techniques, other suitable formation process, or combinations thereof.

Figure 7D:
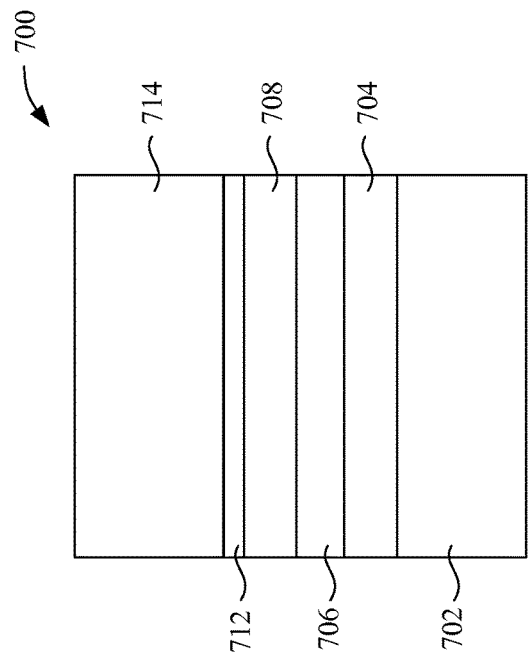

FIG. 7D is a cross-sectional view of a portion of semiconductor device 700 following operation 630 in accordance with some embodiments. In comparison with FIG. 7C, semiconductor device 700 includes a metal gate 714 over TiSiON layer 712. TiSiON layer 712 helps to prevent diffusion from metal gate 714 into titanium nitride layer 708.

In comparison with other approaches, the silicon treatment of method 600 improves control of the thickness of the TiSiON layer. Controlling the number of silicon monolayers formed determines an amount of the reaction limiting material silicon. Controlling the temperature of the annealing process controls a depth the silicon from the silicon monolayers diffuses into the titanium nitride layer. The silicon treatment of method 600 also helps to reduce variation within a wafer caused by planarization or grinding processes.

In some embodiments, additional operations are added to method 600. In some embodiments, an order of operations in method 600 is altered.

One aspect of this description relates to a method of making a semiconductor device. The method includes forming a titanium nitride layer over a gate dielectric layer. The method further includes performing a silicon treatment on the titanium nitride layer to form at least one silicon monolayer over the titanium nitride layer. The method further includes driving silicon from the at least one silicon monolayer into the titanium nitride layer to form a TiSiON layer.

Another aspect of this description relates to a method of making a semiconductor device. The method includes forming a titanium nitride layer over a gate dielectric layer. The method further includes forming at least one silicon monolayer over the titanium nitride layer. The method further includes reacting the at least one silicon monolayer with the titanium nitride layer to form a TiSiON layer.

Still another aspect of this description relates to a method of making a semiconductor device. The method includes forming a titanium nitride layer over a dielectric layer. The method further includes performing a silicon treatment on the titanium nitride layer to form at least one silicon monolayer over the titanium nitride layer. The method further includes performing a thermal treatment on the semiconductor device to form a TiSiON layer. The method further includes depositing a gate electrode over the TiSiON layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of making a semiconductor device, the method comprising:
   forming a titanium nitride layer over a gate dielectric layer;
   performing a silicon treatment on the titanium nitride layer to form at least one silicon monolayer over the titanium nitride layer; and
   driving silicon from the at least one silicon monolayer into the titanium nitride layer to form a TiSiON layer.

2. The method of claim 1, wherein the performing of the silicon treatment comprises repeating the silicon treatment to form a plurality of silicon monolayers over the titanium nitride layer.

3. The method of claim 1, wherein the performing of the silicon treatment comprises performing the silicon treatment in the presence of a silicon-containing gas and a carrier gas.

4. The method of claim 3, wherein the performing of the silicon treatment comprises performing the silicon treatment in the presence of the carrier gas comprising at least one of helium, argon, neon or nitrogen gas.

5. The method of claim 3, wherein the performing of the silicon treatment comprise performing the silicon treatment in the presence of the silicon-containing gas comprising at least one of silane, disilane or silicon tetrachloride.

6. The method of claim 1, wherein the driving of the silicon into the titanium nitride layer comprises annealing the semiconductor device in the presence of oxygen gas or nitric oxide.

7. The method of claim 1, further comprising depositing an interfacial layer over a substrate, wherein the interfacial layer is between the gate dielectric layer and the substrate.

8. The method of claim 7, wherein the depositing of the interfacial layer comprises depositing the interfacial layer comprising silicon oxide, silicon nitride or silicon oxynitride.

9. The method of claim 1, further comprising depositing the gate dielectric layer directly on a substrate.

10. A method of making a semiconductor device, the method comprising:
forming a titanium nitride layer over a gate dielectric layer;
forming at least one silicon monolayer over the titanium nitride layer; and
reacting the at least one silicon monolayer with the titanium nitride layer to form a TiSiON layer.

11. The method of claim 10, wherein the forming of the at least one silicon monolayer comprises forming the at least one silicon monolayer having a thickness of which is an integer multiple of a single atom.

12. The method of claim 10, wherein the reacting of the at least one silicon monolayer with the titanium nitride layer comprises annealing the semiconductor device in the presence of nitrogen gas or ammonium.

13. The method of claim 10, further comprising depositing a metal gate electrode over the TiSiON layer.

14. The method of claim 10, further comprising depositing the gate dielectric layer directly on a substrate.

15. A method of making a semiconductor device, the method comprising:
forming a titanium nitride layer over a dielectric layer;
performing a silicon treatment on the titanium nitride layer to form at least one silicon monolayer over the titanium nitride layer;
performing a thermal treatment on the semiconductor device to form a TiSiON layer; and
depositing a gate electrode over the TiSiON layer.

16. The method of claim 15, wherein the performing of the silicon treatment comprises repeating the silicon treatment to form a plurality of silicon monolayers over the titanium nitride layer.

17. The method of claim 15, further comprising depositing an interfacial layer on a substrate, wherein the interfacial layer is between the dielectric layer and the substrate.

18. The method of claim 15, further comprising depositing the dielectric layer directly on a substrate.

19. The method of claim 15, wherein the performing of the silicon treatment comprises performing the silicon treatment in the presence of silane, disilane or silicon tetrachloride, for a duration of about 10 seconds to about 100 seconds at a temperature ranging from 300° C. to about 420° C.

20. The method of claim 15, wherein the performing of the thermal treatment comprises annealing the semiconductor device in the presence of nitrogen gas or ammonium, for a duration of about 0.1 seconds to about 10 seconds at a temperature ranging from about 600° C. to about 1000° C.

* * * * *